United States Patent
Sehrschoen et al.

(10) Patent No.: US 11,906,285 B2
(45) Date of Patent: Feb. 20, 2024

(54) METHOD FOR STORING REAL DATA RELATING TO A BODY CONTOUR OF A BODY

(71) Applicant: Fill Gesellschaft m.b.H., Gurten (AT)

(72) Inventors: Harald Sehrschoen, Waldzell (AT); Alois Wiesinger, Weibern (AT)

(73) Assignee: Fill Gesellschaft m.b.H., Gurten (AT)

( * ) Notice: Subject to any disclaimer, the term of this patent is extended or adjusted under 35 U.S.C. 154(b) by 609 days.

(21) Appl. No.: 16/972,123

(22) PCT Filed: Jun. 21, 2018

(86) PCT No.: PCT/AT2018/060126
§ 371 (c)(1),
(2) Date: Dec. 4, 2020

(87) PCT Pub. No.: WO2019/241809
PCT Pub. Date: Dec. 26, 2019

(65) Prior Publication Data
US 2021/0231433 A1 Jul. 29, 2021

(51) Int. Cl.
G01B 11/24 (2006.01)
G06F 30/12 (2020.01)
G06F 30/27 (2020.01)
G06T 17/20 (2006.01)

(52) U.S. Cl.
CPC .............. *G01B 11/24* (2013.01); *G06F 30/12* (2020.01); *G06F 30/27* (2020.01); *G06T 17/20* (2013.01)

(58) Field of Classification Search
CPC ................................ G01B 11/24; G06F 30/12
USPC ......................................................... 702/167
See application file for complete search history.

(56) References Cited

U.S. PATENT DOCUMENTS

| | | | |
|---|---|---|---|
| 6,522,993 B1 * | 2/2003 | Tomko | G01B 11/24 702/152 |
| 7,613,539 B2 | 11/2009 | Bae et al. | |
| 7,821,513 B2 | 10/2010 | Bae et al. | |
| 8,867,806 B2 * | 10/2014 | Hibbard | G06T 19/20 382/199 |

(Continued)

FOREIGN PATENT DOCUMENTS

| | | |
|---|---|---|
| DE | 102007021697 A1 | 11/2007 |
| DE | 102007021753 A1 | 11/2007 |
| JP | 2010-176573 A | 8/2010 |

OTHER PUBLICATIONS

International Search Report in PCT/AT2018/060126, dated Nov. 21, 2018.

*Primary Examiner* — Ricky Go
(74) *Attorney, Agent, or Firm* — Collard & Roe, P.C.

(57) ABSTRACT

The invention relates to a method for storing real data of a real body contour (11) of a body (8). The method comprises the method steps:
creating a model surface grid (6) with multiple grid points (7), said model surface grid (6) representing a model body contour (5);
manufacturing the body (8) based on the model body contour (5) of the CAD data;
determining real data of the manufactured body (8);
creating a memory surface grid (15) of the real body contour (11) by means of the computer (3);
storing the memory surface grid (15) on a data carrier (19) for further processing of the data.

20 Claims, 4 Drawing Sheets

(56) References Cited

U.S. PATENT DOCUMENTS

Figure 1:
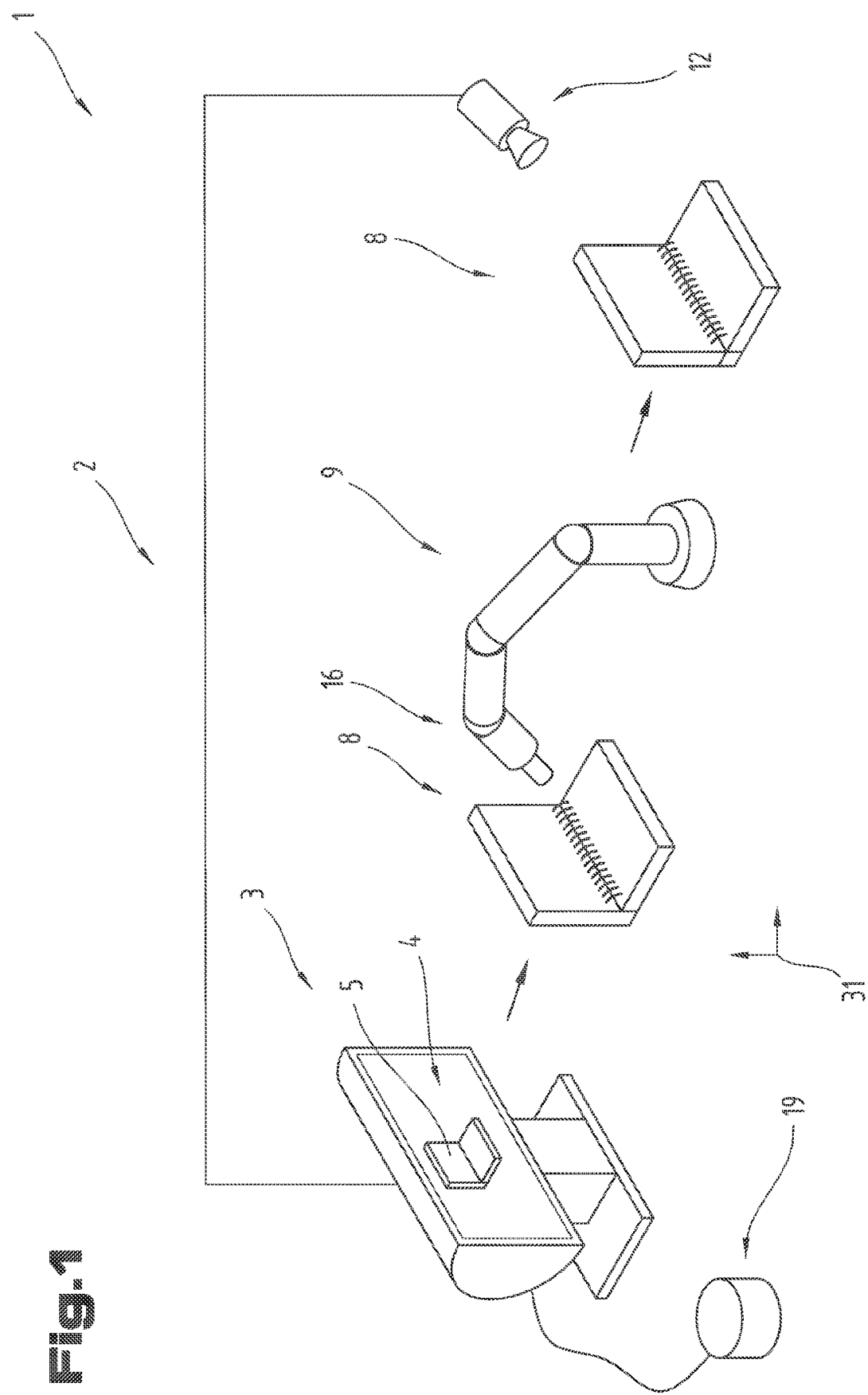

| | | | |
|---|---|---|---|
| 2003/0052882 A1* | 3/2003 | Sinn | G06T 15/00 |
| | | | 345/440 |
| 2005/0168460 A1* | 8/2005 | Razdan | G06F 16/904 |
| | | | 345/419 |
| 2013/0110461 A1* | 5/2013 | Chang | G05B 19/401 |
| | | | 702/155 |
| 2015/0339851 A1 | 11/2015 | Date et al. | |
| 2018/0247147 A1* | 8/2018 | Polidor | G06T 7/33 |

\* cited by examiner

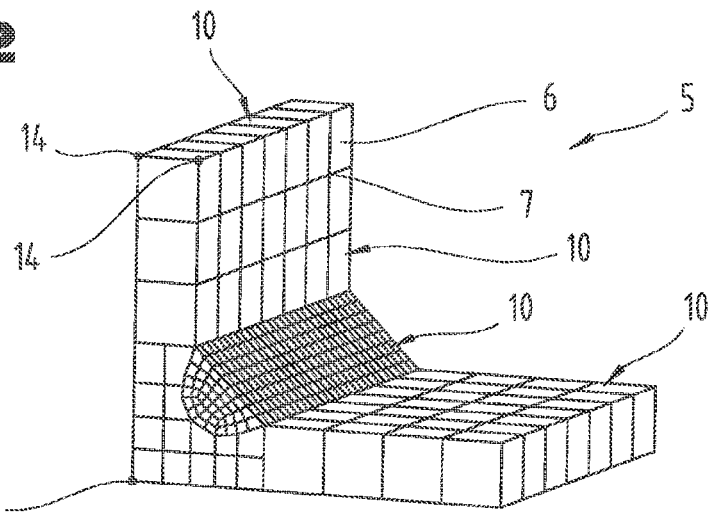
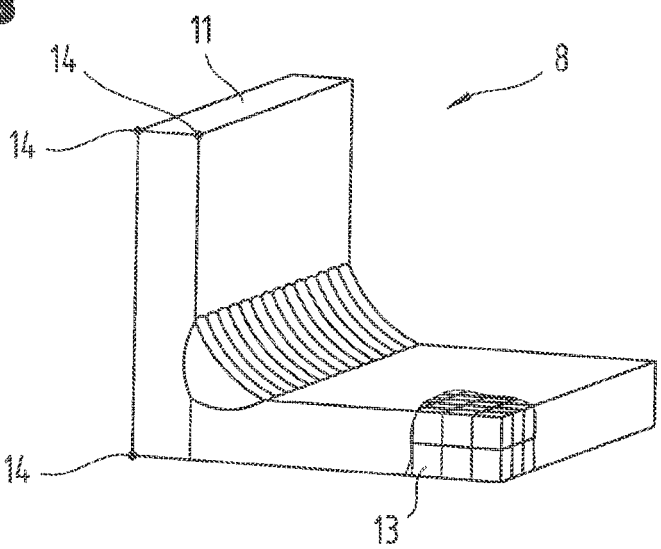
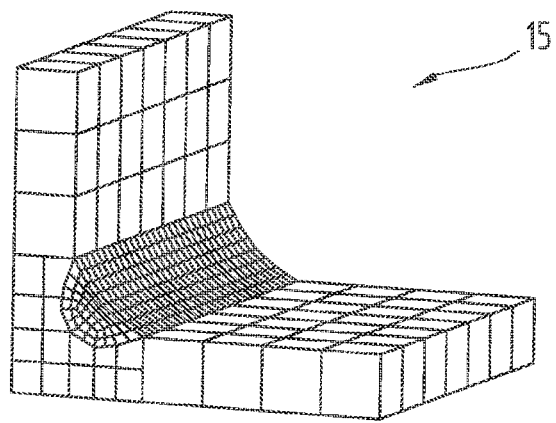

METHOD FOR STORING REAL DATA RELATING TO A BODY CONTOUR OF A BODY

CROSS REFERENCE TO RELATED APPLICATIONS

This application is the National Stage of PCT/AT2018/060126 filed on Jun. 21, 2018, the disclosure of which is incorporated by reference. The international application under PCT article 21(2) was not published in English.

The invention relates to a method for storing real data of a body contour of a body, as well as to a system for data processing, a production plant, a computer program product and a computer-readable storage medium for carrying out the method.

For the purpose of quality assurance, it is often required to measure the actual geometry of the manufactured components and to store it clearly assigned to the component in order to be able to carry out an evaluation and/or troubleshooting in case of a future component failure, for example. This is often also required in serial production where traceability of the actually manufactured geometry of the components can be required.

Diverse methods for measuring manufactured components and for storing the measuring data are known from the prior art. The surface of the component is discretized and divided into individual points of a surface grid, wherein the surface grid is stored. These methods have the disadvantage that a large amount of data has to be stored if a high resolution of the surface grid is chosen. If a low resolution of the surface grid is chosen, the accuracy of the surface grid is often insufficient. An adaptive grid generation during the measurement of the component is not possible, since it is not possible to detect automatically where a close-meshed grid is necessary.

The object of the present invention was to overcome the disadvantages of the prior art and to provide a method, by means of which the real data can be stored using as little memory space as possible but still with a sufficiently high accuracy.

This object is achieved by means of a device and a method according to the claims.

The method according to the invention, at least in individual method steps, is a computer-implemented method.

The subject matter of the invention is a method for storing real data of a real body contour of a body. The method comprises the method steps:
creating a model surface grid with multiple grid points, which model surface grid represents a model body contour, wherein the model surface grid is created in a computer based on CAD data of a virtual body, wherein at least individual partial surfaces of the overall surface of the virtual body are discretized separately in a grid generation;
manufacturing the body based on the model body contour of the CAD data;
determining real data of the manufactured body;
creating a representation, in particular of a real surface grid, of the real body contour based on real data and subsequently adapting the model surface grid of the model body contour to the representation, in particular the real surface grid, of the real body contour by displacing individual grid points of the model surface grid and thereby creating a memory surface grid of at least a part of the real body contour by means of the computer;
storing the memory surface grid on a data carrier for further processing of the data.

It can further be provided that the real data of the manufactured body is determined by measuring the manufactured body by means of a measuring means.

Moreover, it can be provided that during the measuring operation, the model surface grid of the model body contour is directly adapted to the measuring data of the real body contour by displacing individual grid points of the model surface grid to the respectively measured position of the real body contour and, thereby, a memory surface grid of the real body contour is generated by means of the computer.

In particular, it can be provided that the method for storing measuring data of a real body contour of a body comprises the following method steps:
creating a model surface grid with multiple grid points, said model surface grid representing a model body contour, wherein the model surface grid is created in a computer based on CAD data of a virtual body, wherein at least individual partial surfaces of the overall surface of the virtual body are discretized separately in an adaptive grid generation so as to provide a different resolution of the model surface grid at different partial surfaces;
manufacturing the body based on the model body contour of the CAD data;
measuring the manufactured body by means of a measuring means and
a) creating a real surface grid of the real body contour based on the measuring data and subsequently adapting the model surface grid of the model body contour to the real surface grid of the real body contour by displacing individual grid points of the model surface grid and thereby creating a memory surface grid of the real body contour by means of the computer; or
b) during the measuring operation, directly adapting the model surface grid of the model body contour to the measuring data of the real body contour by displacing individual grid points of the model surface grid to the respectively measured position of the real body contour and, thereby, creating a memory surface grid of the real body contour by means of the computer;
storing the memory surface grid on a data carrier for further processing of the data.

The method according to the invention entails the surprising advantage that the file size for storing the memory surface grid for storing the memory surface grid is very small. At the same time, the memory surface grid still has a sufficient accuracy in the relevant regions. This can be achieved in that already during creation of the model surface grid, the regions with a complex contour and/or the regions in which a higher accuracy is required can be discretized with a higher resolution than those regions of the model surface grid which do not have a high complexity and/or which can be manufactured with a high accuracy and/or in which high accuracy is not required. Thus, when the manufactured body is measured and/or when the real surface grid is created, the grid structure of the model surface grid is already known, whereby just the individual grid points of the grid structure of the model surface grid have to be adapted to the characteristics in the manufactured body. This entails not only the advantage of the lower required memory capacity but further entails the surprising advantage that measuring the manufactured body can be carried out easily and efficiently.

It can further be provided that the model surface grid and/or the resolution of the model surface grid during measuring the manufactured body is used for providing the required scanning path to the measuring means and/or for controlling the travel speed and/or the resolution of the measuring means according to the resolution of the model surface grid. This entails the surprising advantage that not only the quality of measuring but also the speed of measuring can be improved.

The alternative method steps a and b of the method according to the invention both achieve the object of the invention, namely providing a memory surface grid of the real body contour of the manufactured body, which has a high accuracy and a small amount of data.

Storing the memory surface grid on a data carrier entails the advantage that the memory data of the real body contour of the manufactured body can be kept available for future tasks. In particular, it can be required that in a serial production the memory surface grid can be unambiguously assigned to the respective measured body via an identification feature, for example a consecutive numbering.

It can further be provided that each individual partial surface of the overall surface of the virtual body is discretized separately in an adaptive grid generation. In this respect, each individual surface can be assigned a separate resolution.

It can further be useful if, in the course of storing the memory surface grid, the absolute coordinates of the grid points of the memory surface grid are stored. This entails the advantage that the memory surface grid, independently of the model surface grid, can be opened in any program and/or is available in any program.

In the alternative to this, it can be provided that during storing of the memory surface grid merely the displacement values of the grid points of the memory surface grid in relation to the model surface grid are stored. This entails advantages in particular in large-scale serial production, since by this measure the amount of data of the memory surface grid can be further reduced. In particular, it can for example be provided that data entries are created merely for those grid points of the memory surface grid which have a deviation to the model surface grid.

Moreover, it can be provided that based on the model surface grid of the model body contour, a simulation is carried out and that in a further method step, the model surface grid of the model body contour is replaced by the memory surface grid of the real body contour and the simulation is adapted or carried out again by means of the data of the memory surface grid of the real body contour for the respective manufactured body or composition of multiple manufactured bodies. This entails the surprising advantage that the amount of data and/or the computing performance for the simulation of the actually manufactured body can be kept as low as possible. A further advantage is that the data of the actually manufactured body allow for an assessment of the suitability for use in their field of application. In particular, by the described method steps, the model surface grid can be easily replaced by the memory surface grid in the simulation, since both surface grids have a similar data structure, wherein merely the grid points are partially slightly displaced.

For example, it can be provided that in a first method step, a production machine is constructed in a CAD program. Based on this CAD data of the virtual production machine, the individual components of the virtual production machine can be discretized, such that corresponding model surface grids for simulations can be generated. The model surface grids are subsequently transferred into a simulation model to allow for the simulation to be performed. Such simulations can be for example strength simulations, vibration simulations, flow simulations, heat conduction simulations or the like. In this regard, the component behavior can be simulated for individual components. In models of complex production machines, for example, the behavior of the production machine and/or the appearance of the product of a product produced in this production machine can be simulated. For example, the mechanical processing on a product can be simulated and the vibrations occurring in the production machine in this context can be simulated. Hence, for example, a possible surface of a product to be created can be simulated. Furthermore, flows or heat conduction in casting processes can also be simulated. Thus, for example, the welding temperature curve, in particular the cooling time t8/5 in the welding process can be simulated.

In a further method step, for example, the individual bodies of the production machine described above can be manufactured and be measured and the measuring data can be stored in accordance with to the method according to the invention. In this regard, of course, it is also possible that the production machine, which serves for manufacturing the bodies, itself was also measured in the process described herein and/or if there is a simulation model for it.

In a subsequent method step, the already created simulation model, which was created based on the CAD data of the virtual and thus ideal production machine or a virtual product, can easily be replaced by the real body contour of the manufactured production machine or the manufactured product and hence, the simulation can be easily adapted. As described above, this is favored by the general structure of the model surface grid and of the memory surface grid having its uniform data structure and merely the grid points being partially displaced.

By the indicated measures, it is thus easily possible to create a simulation model for a machine which is to be manufactured serially, and to subsequently adapt the once created simulation model to the actual manufactured processing plant with a computing and/or processing effort as low as possible. Thus, simulation models can be provided for each actually manufactured processing plant, by means of which a simulation of processing and/or manufacturing a workpiece on the processing plant can be carried out.

A design according to which it can be provided that during discretization of the virtual body, a resolution of the model surface grid is finer in those regions in which a weld seam is provided than a resolution of the model surface grid in those regions of the virtual body in which no weld seam is provided, is also advantageous. Hence, the fact that weld seams during production usually have a low accuracy and/or a complex surface compared to the remaining surfaces can be taken into account.

It can further be provided that the data of the real surface grid is deleted as soon as the data of the memory surface grid has been stored.

According to a further development, it is possible that prior to adapting the model surface grid of the model body contour to the representation, in particular the real surface grid, of the real body contour, there is a method step for aligning the representation, wherein at least one reference surface or reference points on the model body contour are determined, which have the highest production accuracy on the body and that the representation of the real body contour is interpolated to the reference points in relation to its position in order to align the representation of the real body contour as far as possible with the model surface grid with respect to its orientation and/or position. This is particularly advantageous where individual reference surfaces and/or reference points have a high positional accuracy, which can be made use of in this case.

In the alternative to this, it can also be provided that a reference object, which serves for determining the orientation and position of the body, is arranged on the body.

In the alternative to this, it can also be provided that prior to adapting the model surface grid of the model body contour to the representation, in particular the real surface grid, of the real body contour, there first is a method step for aligning the representation of the real surface grid, wherein the model surface grid is rotated and/or displaced such in relation to its orientation and/or position that, as viewed across the overall surface, a distance between the model surface grid and the representation of the real body contour is as small as possible. This method can also be referred to as best fit method. In this regard, the real surface grid and the model surface grid are brought into conformity as well as possible, in order to subsequently adapt the memory surface grid in relation to the model surface grid as little as possible by displacing grid points.

In a further alternative, it can be provided that the body during measuring is clamped in a clamping holder in a predefined position and/or orientation, such that the body to be measured is correctly arranged with respect to its position and/or orientation already during measuring. Hence, it is not required that the location of the body is referenced since it is predefined by the clamping holder.

It can further be provided that for aligning or fitting in the representation of the real body contour to the model surface grid, in particular in the best fit method, an optimization algorithm, such as an artificial neural network, is used. Artificial neural networks are particularly well suited for such fitting methods.

It can further be provided that a deviation tolerance is defined on the model surface grid of the model body contour, and that a signal is output when the measuring values of the body or the representation, in particular the real surface grid, of the real body contour is at least in some sections outside the deviation tolerance of the model surface grid of the model body contour. By this measure, a deviation of the body outside the tolerance can be signaled to the user.

The signal for showing the exceeding of the deviation tolerance can for example be an acoustic or an optical signal. It is further also conceivable that the signal, when the deviation tolerance is exceeded, is further processed merely inside the computer.

According to a particular embodiment, it is possible that the measuring means for measuring the manufactured body comprises an optical detection means, in particular a hand-guided optical detection means. Components can be efficiently and easily measured in particular by means of an optical detection means.

It can further be provided that already during measuring the manufactured body and creating a real surface grid of a real body contour, the method step for aligning the real surface grid is carried out, wherein a deviation tolerance is defined on the model surface grid of the model body contour, and wherein a signal is output when the real surface grid of the real body contour in some sections is outside the deviation tolerance of the model surface grid of the model body contour. Here, for example, the measurement result can be output directly on a screen, thus signaling possible error locations to the user almost without any delay.

According to an advantageous embodiment, it can be provided that during manufacturing the body, production parameters are recorded and in a learning phase, the influences of the production parameters on the real body contour is determined by evaluation of the representation of the real body contour, in particular the real surface grid, of the body or of the memory surface grid of the measured body, and are stored in an influence model, and that after completion of the learning phase, the representation, in particular the real surface grid, of the real body contour of a subsequently manufactured body is created based on the production parameters present in the respective production process, taking into account the influence model, without measuring the body. By means of this measure, it is possible that in serial production of components, not all manufactured bodies have to be actually measured but that the real surface grid for at least some bodies can be created merely using the production parameters. For instance, it is conceivable that after completion of the learning phase, no single one of the further manufactured components is measured.

In the alternative to this, it is also conceivable that after completion of the learning phase, the components that are manufactured after completion of the learning phase are measured in a cyclical or anti-cyclical interval and/or upon occurrence of certain criteria. The criteria making measuring of the body necessary can for example be the reaching or exceeding of certain specified tolerance limits of the production parameters.

Hence, for example when a tolerance limit of a production parameter is exceeded, it can be evaluated by measuring whether the exceeding of the tolerance limit of the production parameter also actually results in exceeding of the accuracy tolerance of the body. It is further also conceivable that the tolerance limits of the production parameters are adjusted automatically on the basis of the measurement result. Thus, for example, a body to be produced in the future, which has production parameters that are outside the original tolerance limit for production parameters, but within the adjusted tolerance limit for production parameters, no longer needs to be measured.

When creating the influence model, a large amount of data of production parameters and the direct effect of these production parameters on the actually manufactured workpiece are collected. In this regard, relations of different production parameters and/or their influences on the production are established. After completion of the learning phase, the result of the production parameters that actually occurred can be interpolated on the basis of the data stored in the influence model. As described above, the influence model can also be further adapted after completion of the learning phase.

In a further development, it is conceivable that an influence model is created, for example only for a pre-series of a production machine, and that said influence model is merely adapted for the further production machines of a series, so that every single production process does not actually also require a learning phase. If the production machines themselves are measured in accordance with the described method and/or a simulation model has been created, then it is also conceivable that the adaptations of the influence model are made on the basis of said measuring data.

Furthermore, it is also conceivable that, in the course of this, different influence models are created on different production machines of a series, and that the production machines are interconnected with one another, whereby the influence models of the individual production machines can be adapted and/or supplemented. Particularly in the case of machines built during a later stage of a series, the influence models can, for example, be supplemented and/or adapted with the gained, age-related know how, for instance with regard to wear, of machines built at an earlier stage of a series.

Of course, it is also conceivable that the learning effects do not adapt only the influence model for the prediction of the appearance of the manufactured body. In fact, it is also conceivable that the production parameters are adapted by learning effects of manufactured bodies outside the tolerance limit. In this regard, the relations for adapting the production parameters known from the influence model may be used.

Moreover, it may be provided that for creating the influence model of the production parameters and/or for creating the real surface grid of the real body contour and/or for amending the production parameters on the basis of the learning process described above, an artificial neural network and/or deep learning optimization methods are used.

In particular, it may be advantageous if the body is manufactured in an automated production process by means of a production machine having a PLC control, wherein the production parameters are obtained directly from the PLC control. Thus, the production parameters can be easily read.

A PLC control (programmable logic controller) serves for controlling the actuators of a production machine. By means of the PLC control, the individual method steps can be controlled in a sequenced manner A CNC control (computerized numerical control) is a special embodiment variant of a PLC control, in which individual actuator movements can also be layered and thus be performed simultaneously in order to be able to realize a continuous-path control, for instance.

As an alternative or in addition to this, it may also be provided that at least individual production parameters are detected by at least one sensor, which is arranged on a processing tool, in particular on a hand-guided processing tool, or coupled thereto. By this measure, it can be achieved that the production parameters can be adapted by the actually occurring conditions which are detected by the sensors, and/or that the actually occurring conditions can be detected by the sensors.

In a first exemplary embodiment, it can be provided that the sensor is arranged directly on the processing tool.

In particular, it can be provided that a data transmission between the processing tool and the production machine is made possible. In this regard, it may be provided, for instance, that a data connection interface for transmitting data from the sensors to the production machine is provided in the tool holder, such as a short taper shaft holder, of a processing tool in a production machine.

In a further exemplary embodiment, it may be provided that the sensor is not arranged directly on the processing tool, but rather on a tool carrier receiving the processing tool. In such an embodiment, the production parameter of the processing tool can be recorded by means of the tool carrier.

A processing tool within the meaning of this document may be a tool for machining, a bending tool, a welding head or any other tool which serves for influencing the condition of the body.

In particular, it can be provided that, for creating the influence model, the individual production parameters and/or their chronological sequence are combined with one another.

In particular, it can be provided that the sensor comprises an acceleration sensor and/or a gyro sensor, which are configured for detecting the position and/or the orientation of the processing tool throughout a chronological sequence.

In a first exemplary embodiment, it may be provided that the processing tool is configured in the form of a welding head. In particular, it can be provided that, as the first production parameter in the creation of a weld seam, the position and/or orientation of the welding head during the welding operation is detected by means of the sensor. This is advantageous particularly in the case of hand-guided welding heads. In particular, it can be provided that a welding angle and/or a feed angle and/or the position of a tool center point of the welding head and/or a welding head feed speed is detected by the sensor.

Further production parameters relevant for the creation of a weld seam can be obtained directly from the settings of the welding machine, for instance. By way of example, this may be the welding rod feed speed, the welding rod diameter or the electrical welding power. In this regard, the electrical welding power is calculated from the welding voltage and the welding current.

Within the meaning of this document, the welding rod is understood to be both the wire of a gas-shielded welding device and the electrode of an electrode welding device. In the case of an electrode welding device, the welding rod feed speed is calculated from the change in distance over time of the tool center point relative to the workpieces to be welded.

Further production parameters may also be entered manually. Examples for this can be the material to be welded of the workpieces to be welded into one body, the material thickness of the workpieces, the welding position, the material of the welding rod or the welding rod diameter.

The welding positions describe or designate the position of the weld seam during the welding operation. The welding positions result from the position of the workpieces to be welded and the accessibility of the burner relative to the seam.

In particular, it can be provided that the workpieces to be welded are clamped in a clamping device, so that the welding positions are clearly defined.

Furthermore, it can be provided that a virtual production machine is constructed in the CAD and process parameters of the virtual production machine, such as a maximum feed speed of a turning tool, are defined, and that the process parameters of the actually manufactured and measured production machine are adapted in a self-learning manner on the basis of the measuring data, in particular by using an artificial neural network. By this measure, it can be achieved that the process parameters of the virtual production machine can be calculated and/or maximized, and said process parameters can be adapted accordingly in a self-learning manner in the actually manufactured production machine, in order to be able to increase the efficiency of the individual manufactured production machines. The adaptation operation can be optimized, for example, by interconnecting different production machines of a model range. In particular, it can be provided here that the production parameters are adapted to compensate wear conditions caused by aging.

In a first embodiment variant, the measuring means can comprise an optical detection means. The optical detection means can be, for example a camera system, a CCD sensor, a profile projector, a confocal microscope, a white interferometer or an atomic force microscope.

An optical detection means in the form of an optical roughness sensor is described in ISO 25178, for instance.

In a further embodiment variant, the measuring means can comprise a tactile detection means. Here, a probe, in particular a probing ball, can be configured for reading the surface of the body.

In yet another embodiment variant, it may also be conceivable by way of example that the measuring means comprises a wave sensor, for example an ultrasonic sensor.

According to the invention, a system for data processing, comprising a computer with a user interface and a data carrier, and a measuring means is formed. In this regard, the computer and the measuring means are configured for performing the steps of the method according to the invention.

According to a further development, it is possible that the measuring means comprises a hand-guided detection means. This particularly entails the advantage that a hand-guided detection means can be used flexibly and does not require prior programming Thus, differently formed bodies with complex designs can be detected easily and cost-effectively.

According to the invention, a production plant comprising a system for data processing according to the invention and a production machine according to the invention are provided.

According to the invention, a computer program product is provided, which comprises commands which cause the system for data processing to perform the method.

According to the invention, a computer-readable storage medium is provided comprising commands which, upon execution by a computer, cause the same to perform the method according to the invention.

A surface grid has multiple grid points distributed in the space, which grid points are connected to one another via grid lines. The grid lines can be straight or, in special cases, also be configured in the form of parameterized curves. In particular, it can be provided that a triangle grid is formed. Moreover, a polyhedra grid, such as rectangle grid or a hexagon or octagon grid, may also be formed.

The surface grid can be formed as a structured grid with an even topology, although not necessarily with an even cell geometry. In the case of structured grids, the cells are present in an even raster, so that the cells can be clearly indicated by integral numbers.

Moreover, it is also conceivable that the surface grid is formed as an unstructured grid. Unstructured grids have no defined topology and no even grid cell geometry. Unstructured grids are usually the result of an adaptation process. Grids made up of complex cells, so-called polygon grids, are also known.

The fineness of surface grid reticulation is referred to as the resolution of the surface grid. The finer the resolution of the surface grid the finer the surface grid and the more grid points are present in a certain region. The finer the resolution of the surface grid the greater the required memory space for storing the data, too.

The real surface grid is normally a non-adaptive grid which has the same resolution everywhere. The real surface grid can be created by measuring the body. Alternatively to this, it is also conceivable that the real surface grid is created on the basis of the process parameters.

A computer within the meaning of this document is a processor for data processing. If reference is made to a computer, this may also mean a combination of multiple computers. In particular, it is also possible that individual method steps, such as the creation of the CAD data of the virtual body and the creation of the real surface grid is performed in different computers although, for the sake of simplicity, only one computer is referred to by the same reference number.

The model surface grid adapted to the real body contour is referred to as memory surface grid. In particular, it is conceivable that the data of the originally created model surface grid are not overwritten here, but rather that a copy of the originally created model surface grid is used for creating the memory surface grid, in order to keep the data of the model surface grid available for the creation of further memory surface grids of further bodies.

A manufactured body within the meaning of this document can be a component manufactured in one piece, which is produced for instance by primary shaping, such as casting. Moreover, within the meaning of this document, a body is also understood to be a component manufactured in one piece, which is produced for instance by joining multiple workpieces by means of a welding connection.

Furthermore, within the meaning of this document, a body is also understood to be an assembly composed of multiple components. In this regard, it is conceivable that each of the components is measured individually or that the assembly is measured in an assembled state.

When discretizing the model body contour, a model surface grid having individual grid points is created from the model body contour of the virtual body, which up to this point in time is defined by the parameterization of the CAD data in the CAD program, wherein the individual grid points each have clearly defined coordinates and can therefore be stored independently of the CAD model and/or CAD program used.

The CAD model can contain flat surfaces, enveloping surfaces of geometrically determined solids and also non-uniform rational basic splines (NURBS). NURBS are mathematically defined curves or surfaces.

Moreover, it is also conceivable that for an object having a defined, constant wall thickness, such as a sheet metal component, only a mid-plane and/or mid-surface of the geometry and, additionally, the information regarding the wall thickness are stored. Thereby, additional memory space can be saved.

In this document, the terms surface grid and/or body contour are used, wherein it is pointed out that the scope of protection is not limited to only geometry shells but of course also includes solids. Accordingly, the surface grids may also have a spatial extension within the surface. In particular, it can be provided that, by measuring the manufactured body not only the surface is measured, but material properties, different materials as well as material defects located below the surface can also be detected.

In order to represent the volume of the body, a spatial grid structure such as a polyhedron grid, in particular a tetrahedron grid, or a hexahedron grid may be used.

Moreover, it is also conceivable that the temperature distribution and/or the progression of the temperature distribution is recorded by means of thermography, for instance during the solidification of the cast workpiece. This may be necessary as, during the casting process, different surfaces may cool down differently. Thus, different courses of the solidification of a body may occur, which can lead to different structural compositions.

A production machine within the meaning of this document may be any machine which serves for primary shaping, reshaping, joining or mechanical processing of workpieces. A production machine can be, for example a casting machine, a welding machine, a bending machine, a CNC milling machine or a CNC lathe, a machining center or another machine. The production machine can be configured to be computer-controlled and thus fully automated. Moreover, it is also conceivable that the production machine is controlled by a machine operator, and/or that individual method steps are performed manually. The production machine itself may be composed of bodies which are measured in accordance with the method steps according to the invention.

A representation of the real body contour can be made in the form of a cloud of measuring points, for instance. Moreover, it is also conceivable that a real surface grid is created from the representation of the real body contour, for example from the cloud of points.

Data regarding the condition of a body are seen as real data of a body. The real data can comprise for example geometry data, such as surface data or volume data. Moreover, the real data can also comprise data on the structural composition and/or the material properties of a body.

For the purpose of better understanding of the invention, it will be elucidated in more detail by means of the figures below.

Figure 5:
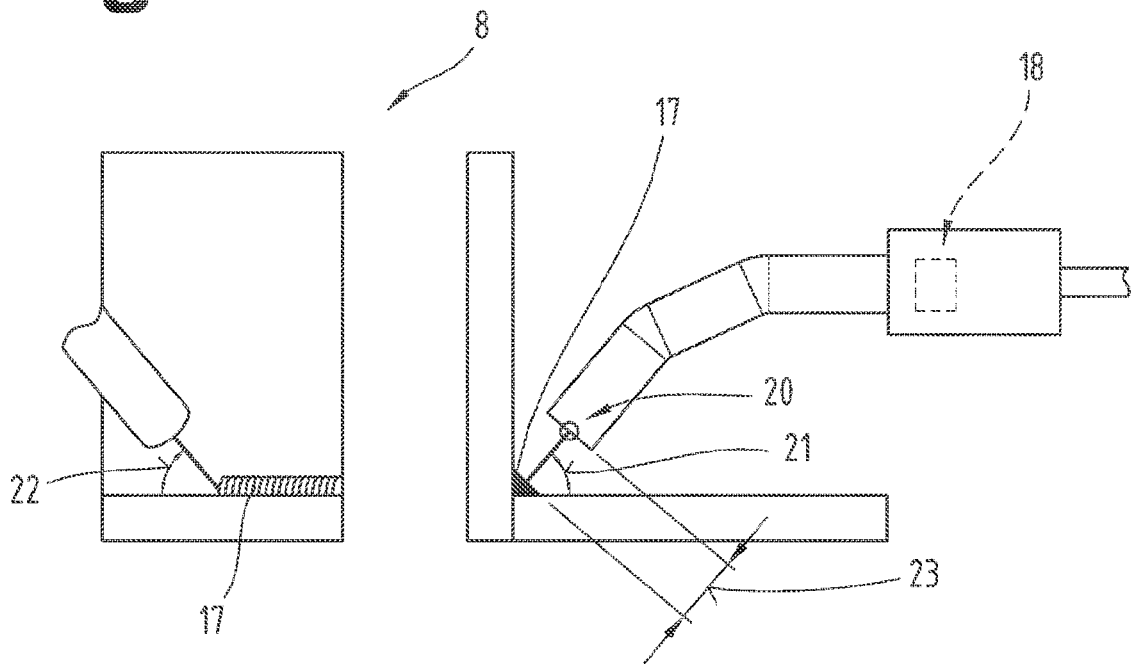
Figure 6:
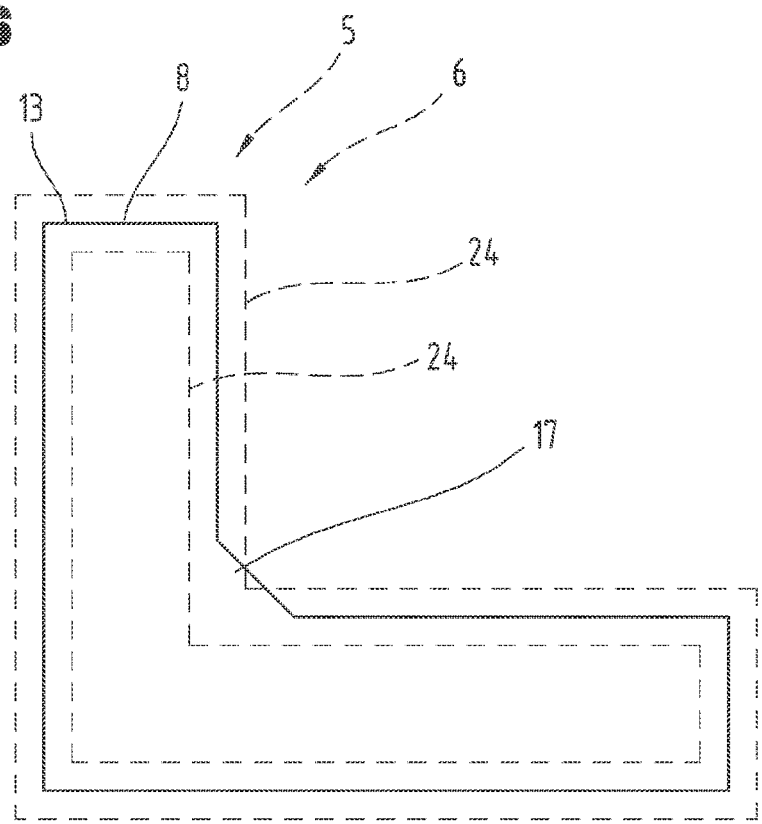
Figure 7:
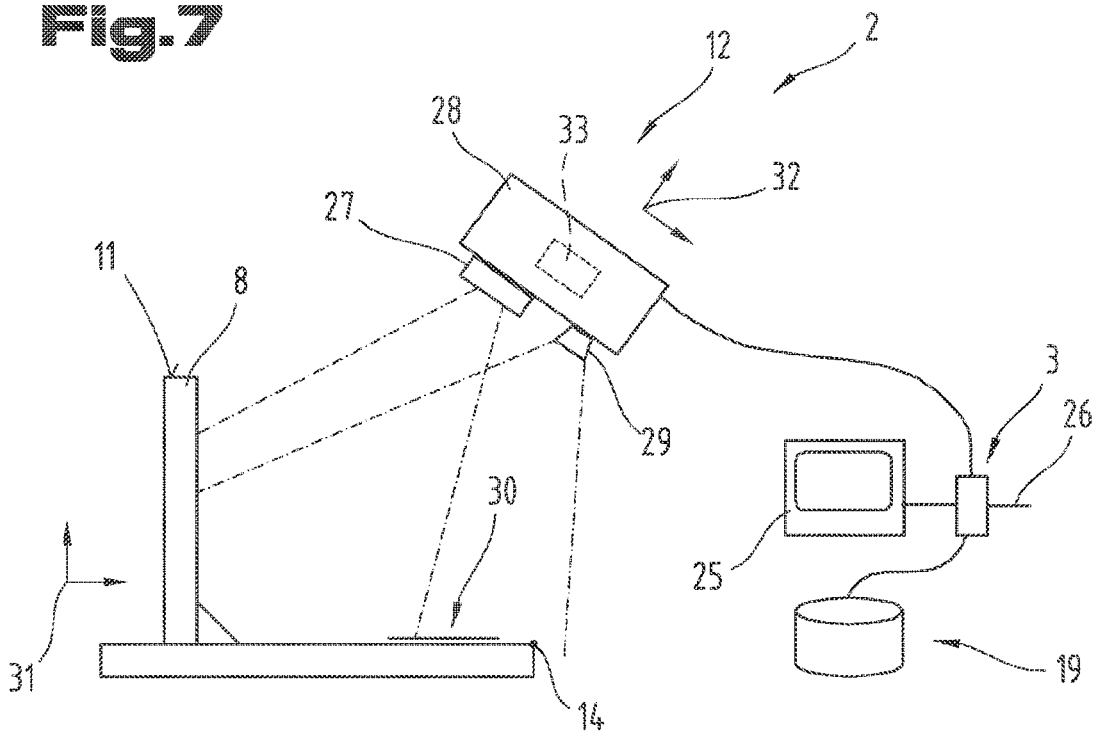
Figure 8:
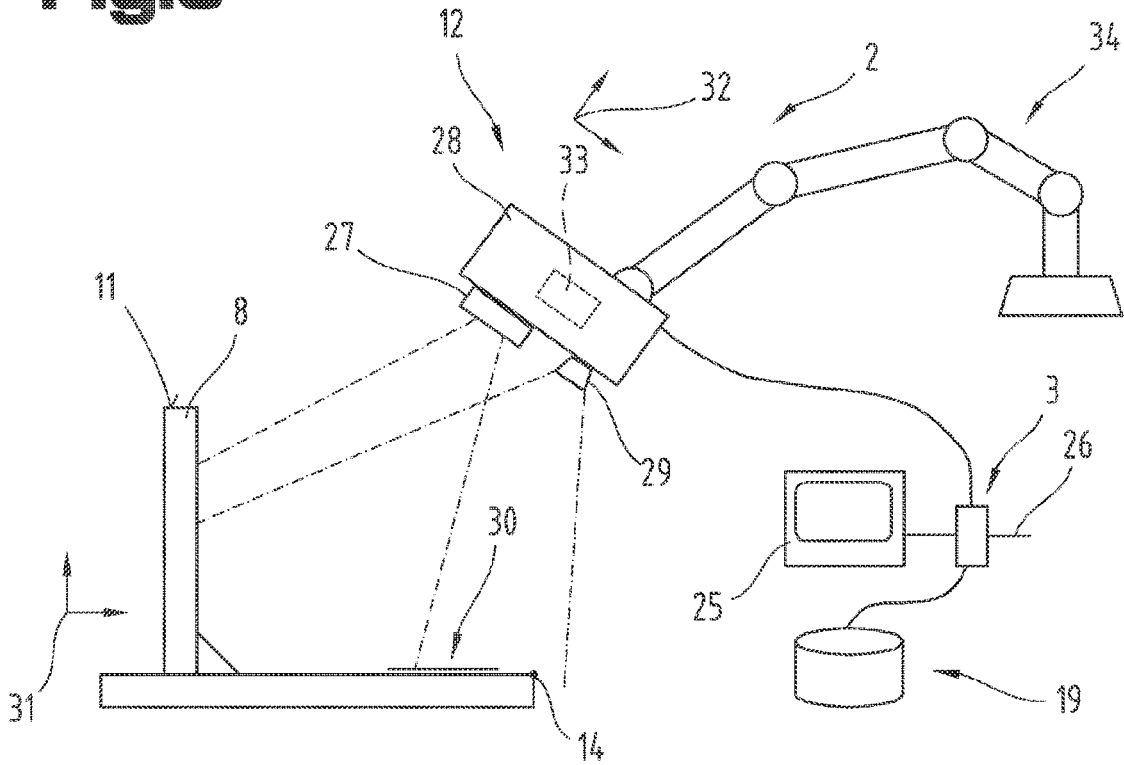

These show in a respectively very simplified schematic representation:

FIG. 1 the construction of an exemplary embodiment of a production plant;

FIG. 2 a perspective view of a model surface grid of a model body contour;

FIG. 3 a perspective view of a real body contour of a manufactured body and/or, schematically adumbrated, the real surface grid of the real body contour;

FIG. 4 a perspective view of a memory surface grid;

FIG. 5 an elevation and a side view of a welding head;

FIG. 6 a representation of a deviation tolerance of a model surface grid;

FIG. 7 a first exemplary embodiment of a system for data processing with a hand-guided measuring head;

FIG. 8 a first exemplary embodiment of a system for data processing with a robot-guided measuring head.

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

FIG. 1 shows a schematic construction of an exemplary embodiment of a production plant 1 and/or a system for data processing 2, on which the method according to the invention can be performed. The system for data processing 2 can be part of the production plant 1.

Moreover, it can be provided that the system for data processing 2 comprises a computer 3 which is schematically represented by a screen in FIG. 1. On the computer 3, a CAD program can be executed, by means of which CAD data of a virtual body 4 can be created. In this regard, the virtual body 4 can be an individual body with a monolithic structure or a body composed of multiple bodies.

A model body contour 5 represents the surface of the virtual body 4.

A combination of FIG. 1 and FIGS. 2 to 4 serves for the further description.

In a further method step, a model surface grid 6 having individual grid points 7, which are interconnected, can be discretized on the basis of the model body contour 5. Such a model surface grid 6 is shown in FIG. 2. In particular, it can be provided here that individual partial surfaces 10 of the model body contour 5 are individually discretized and connected to form a net. In this regard, it can be provided that the individual model surface grids 6 of the individual partial surfaces 10 of the model body contour 5 are coupled to one another at defined interfaces. Here, individual grid points 7 may be predefined, which serve for coupling the individual parts of the model surface grid 6. In other words, the model body contour 5 can be composed of multiple partial surface grids to form a model surface grid 6.

On the basis of the CAD data of the virtual body 4, a real body 8 can be manufactured subsequent to the CAD construction. This may take place with the aid of a production machine 9, for instance. The body 8 has a real body contour 11 which is shown in FIG. 3.

In a further processing step, which is also shown in FIG. 1, the manufactured and thus, real body 8 can be measured by means of a measuring means 12. The real data of the manufactured body 8 can be determined as the output of the measurement. In particular, a representation of the real body contour 11 can be created on the basis of the real data, which have been obtained by the measurement. After measuring, the representation of the real body contour 11 can be present in the form of a cloud of points.

In an alternative embodiment variant, the real data of the manufactured body 8 can be determined directly on the basis of data obtained from the production. Thus, a representation of the real body contour 11 can be obtained directly on the basis of a record of production parameters.

As FIG. 3 schematically adumbrates, it can be provided that a real surface grid 13 is created on the basis of the measuring data of the measuring means 12, which real surface grid 13 represents the real body contour 11 of the body 8. The real surface grid 13 has a fine resolution and is designed as a non-adaptive grid and thus, has an even resolution distributed over the entire surface or a measuring region.

In a further embodiment variant, it may also be provided that real body contour 11 of the body 8 is only measured in a certain measuring region. This measuring region can be defined for example on that region of the body 8 on which production deviation is expected. The rest of the body 8 is not measured here. This entails the advantage that measuring the body 8 can take place in an accelerated manner if not all regions of the body 8 have to be measured.

In a further method step, the real surface grid can be brought into accordance with the model surface grid 6 with respect to its orientation, which may take place via reference points 14, for example. Subsequently, the individual grid points 7 of the model surface grid 6 can be displaced in accordance with the measured real surface grid 13, whereby a memory surface grid 15 can be formed, as it is evident in FIG. 4.

The memory surface grid 15 is thus adapted to the model surface grid 6 with respect to its resolution, but exhibits the exact representation of the real body contour 11 of the body 8. Thus, the memory surface grid 15 combines the advantages of a lower memory space requirement with the most exact representation possible of the manufactured body 8 at the same time.

The memory surface grid 15 can be stored on a data carrier 19. In this regard, the data carrier 19 can be part of the computer 3 or also be an external data carrier 19.

FIG. 5 shows the outline and the side view of the body 8 during production. As it is evident in FIG. 5, it may be provided that a processing tool 16 is used for manufacturing the body 8. The processing tool 16 can be designed in the form of a welding head, as is evident from the exemplary embodiment according to FIG. 5. A welding head serves for joining two or multiple components by means of a weld seam 17.

As is evident from the exemplary embodiment according to FIG. 5, it can be provided that a sensor 18 is arranged on the processing tool 16, by means of which sensor 18 the exact orientation and/or position of the processing tool 16 throughout the chronological sequence can be detected. Hence, particularly the position and/or orientation of a tool center point 20 can be deduced. Thus, it is possible, for example, to define a welding angle 21, a feed angle 22 or a welding head distance 23 from the welding base.

As is evident from FIG. 6, it may be provided that a deviation tolerance 24 is defined on the model surface grid 6 of the model body contour 5, which deviation tolerance 24 may be used to determine whether the body 8 is within said deviation tolerance. When creating the deviation tolerance 24, the model surface grid 6, for example, may be copied inwards and/or outwards at a certain distance.

If the body 8 is outside the deviation tolerance 24, as it is the case in the exemplary embodiment according to FIG. 6 with the weld seam 17, an optical or an acoustic signal, for instance, may be emitted.

Moreover, it is of course also conceivable that the deviation tolerance 24 is stored directly in the model surface grid 6. In this regard, an exceedance of the deviation during the adaptation of the grid points 7 of the model surface grid 6 to the real surface grid 13 and/or during the direct adaptation of the grid points 7 of the model surface grid 6 to the measured body 8, tolerance 24 can be recognized by the grid points 7 being displaced by a value outside the tolerance limit.

FIG. 7 shows an exemplary embodiment of the system for data processing 2. As is evident from FIG. 7, it may be provided that the measuring means 12 comprises a detection means 27.

In particular, it can be provided that the optical detection means 27 is arranged on a measuring head 28. The optical detection means 27 serves particularly for detecting the real body contour 11 of the body 8.

Moreover, a display means 25 can be provided, which is coupled to the computer 3 and serves for displaying measuring data. Moreover, a data connection is provided between the measuring means and the computer 3. The data connection may for example be wired or wireless. Moreover, a data connection 26 between the computer 3 and a network may be provided.

As is evident from FIG. 7, it may be provided that, in addition to the optical detection means 27, a reference means 29 is arranged on the measuring head 28. The reference means 29 may serve for detecting and/or determining the position of the body 8 via the reference points 14 or a reference surface.

Moreover, it is also conceivable that a reference object 30 is arranged on the body 8, by means of which reference object 30 the position of the body 8 can be determined. In this regard, the reference object 30 can be produced with the body 8 during production of the same, for example during casting, and/or it can also be applied to the body 8 afterwards.

Of course, it is also conceivable that the optical detection means 27 and the reference means 29 are realized in one unit.

The reference means 29 can serve particularly for detecting the movement of the measuring head 28 relative to the body 8. In this regard, the movement of the measuring head 28 can be calculated within a measuring head coordinate system 32 and the position of the body 8 in a clamping coordinate system 31. By detecting the exact position of the measuring head 28, the exact position and/or design form of the surface of the body 8 can be detected by means of the optical detection means 27.

As an alternative or in addition to the reference means 29, an acceleration and gyro sensor 33 can be arranged on the measuring head 28, by means of which sensor 33 the exact position of the measuring head 28 can be detected throughout the chronological sequence. Such a construction of the measuring means 12, as it is shown in FIG. 7, can for example be hand-guided.

FIG. 8 shows a further exemplary embodiment of the system for data processing 2. As is evident from FIG. 8, it can be provided that the measuring means 12, in particular the measuring head 28, is guided by means of a robot system 34 and thus, the exact position and/or location of the measuring head 28 can be exactly determined at its point in time. When using the robot system 34, the reference means 29 and/or the acceleration and gyro sensor 33 can thus optionally also be omitted. Especially where the clamping position of the body 8 is known exactly, the referencing means 29 can be omitted.

The person skilled in the art is well aware of the fact that in the exemplary embodiments according to FIGS. 7 and 8 the optical detection means 27 can be replaced by any differently functioning detection means. The reference means 29 can also use diverse detecting mechanisms.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the teaching for technical action provided by the present invention lies within the ability of the person skilled in the art in this technical field.

The scope of protection is determined by the claims. However, the description and the drawings are to be adduced for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10. Finally, as a matter of form, it should be noted that for ease of understanding of the structure, elements are partially not depicted to scale and/or are enlarged and/or are reduced in size.

LIST OF REFERENCE NUMBERS

| | |
|---|---|
| 1 | production plant |
| 2 | system for data processing |
| 3 | computer |
| 4 | virtual body |
| 5 | model body contour |
| 6 | model surface grid |

| | |
|---|---|
| 7 | grid point model surface grid |
| 8 | body |
| 9 | production machine |
| 10 | partial surface |
| 11 | real body contour |
| 12 | measuring means |
| 13 | real surface grid |
| 14 | reference point |
| 15 | memory surface grid |
| 16 | processing tool |
| 17 | weld seam |
| 18 | sensor |
| 19 | data carrier |
| 20 | tool center point |
| 21 | welding angle |
| 22 | feed angle |
| 23 | welding head distance |
| 24 | deviation tolerance |
| 25 | display means |
| 26 | data connection |
| 27 | optical detection means |
| 28 | measuring head |
| 29 | reference means |
| 30 | reference object |
| 31 | clamping coordinate system |
| 32 | measuring head coordinate system |
| 33 | acceleration and gyro sensor |
| 34 | robot system |

The invention claimed is:

1. A method for storing real data of a real body contour of a body, comprising the method steps:
creating a model surface grid with multiple grid points, said model surface grid representing a model body contour, wherein the model surface grid is created in a computer based on CAD data of a virtual body, wherein at least individual partial surfaces of the overall surface of the virtual body are discretized in a grid generation so as to provide a different resolution of the model surface grid;
providing the body manufactured based on the model body contour of the CAD data;
determining real data of the manufactured body;
creating a representation of the real body contour (11) based on real data and subsequently adapting the model surface grid of the model body contour to the representation, of the real body contour and thereby creating a memory surface grid of at least a part of the real body contour by means of the computer;
storing the memory surface grid on a data carrier for further processing of the data, wherein adapting the model surface grid of the model surface contour to the representation of the real body contour is carried out by displacing individual grid points of the model surface grid,
wherein during manufacturing the body, production parameters are recorded and in a learning phase, the influences of the production parameters on the real body contour is determined by evaluation of the representation of the real body contour or of the memory surface grid of the measured body, and are stored in an influence model, and wherein after completion of the learning phase, the representation of the real body contour of a subsequently manufactured body is created based on the production parameters present in the respective production process, taking into account the influence model, without measuring the body.

2. The method according to claim 1, wherein the real data of the manufactured body is determined by measuring the manufactured body by means of a measuring means.

3. The method according to claim 2, wherein during the measuring operation, the model surface grid of the model body contour is directly adapted to the measuring data of the real body contour by displacing individual grid points of the model surface grid to the respectively measured position of the real body contour and, thereby, a memory surface grid of the real body contour is generated by means of the computer.

4. The method according to claim 1, wherein, in the course of storing the memory surface grid, the absolute coordinates of the grid points of the memory surface grid are stored.

5. The method according to claim 1, wherein, in the course of storing the memory surface grid, displacement values of the grid points of the memory surface grid in relation to the model surface grid are stored.

6. The method according to claim 1, wherein, based on the model surface grid of the model body contour, a simulation is carried out and wherein in a further method step, the model surface grid of the model body contour is replaced by the memory surface grid of the real body contour and the simulation is adapted or carried out again by means of the data of the memory surface grid of the real body contour for the respective manufactured body or composition of multiple manufactured bodies.

7. The method according to claim 6, wherein for aligning or fitting in the representation of the real body contour to the model surface grid, an optimization algorithm is used.

8. The method according to claim 1, wherein during discretization of the virtual body, a resolution of the model surface grid is finer in those regions in which a weld seam is provided than a resolution of the model surface grid in those regions of the virtual body in which no weld seam is provided.

9. The method according to claim 1, wherein prior to adapting the model surface grid of the model body contour to the representation of the real body contour, there is a method step for aligning the representation of the real body contour, wherein at least one reference surface or reference points on the model body contour are determined, which have the highest production accuracy on the body and wherein the representation of the real body contour is interpolated to the reference points in relation to its position in order to align the representation of the real body contour as far as possible with the model surface grid with respect to its orientation and/or position.

10. The method according to claim 1, wherein prior to adapting the model surface grid of the model body contour to the representation of the real body contour, there first is a method step for aligning the representation of the real surface grid, wherein the model surface grid is rotated and/or displaced such in relation to its orientation and/or position that, as viewed across the overall surface, a distance between the model surface grid and the representation of the real body contour is as small as possible.

11. The method according to claim 1, wherein a deviation tolerance is defined on the model surface grid of the model body con-tour, and wherein a signal is output when the measuring values of the body or the representation of the real body contour is at least in some sections outside the deviation tolerance of the model surface grid of the model body contour.

12. The method according to claim 1, wherein the measuring means for measuring the manufactured body comprises an optical detection means.

13. The method according to claim 1, wherein the body is manufactured in an automated production process by means of a production machine having a PLC control, wherein the production parameters are obtained directly from the PLC control.

14. The method according to claim 1, wherein at least individual production parameters are detected by means of at least one sensor, which is arranged on a processing tool or coupled thereto.

15. The method according to claim 1, wherein a virtual production machine is constructed in the CAD and process parameters of the virtual production machine are defined, and wherein the process parameters of the actually manufactured and measured production machine are adapted in a self-learning manner on the basis of the measuring data.

16. A system for data processing, comprising a computer having a user interface and a data carrier, wherein the computer is configured for carrying out the steps of the method according to claim 1.

17. The system for data processing according to claim 16, wherein a measuring means is formed which comprises a hand-guided detection means.

18. A production plant, comprising a system for data processing according to claim 16 and a production machine for manufacturing the body.

19. A system for data processing comprising:
  a computer having a computer processor, a user interface, and a data carrier; and
  a non-transitory computer readable medium containing instructions stored therein for causing the computer processor to perform steps of the method according to claim 1.

20. A non-transitory computer readable medium containing computer instructions stored therein for causing a computer processor to perform the method according to claim 1.

* * * * *